(12) United States Patent
Rand et al.

(10) Patent No.: US 8,987,589 B2
(45) Date of Patent: Mar. 24, 2015

(54) ARCHITECTURES AND CRITERIA FOR THE DESIGN OF HIGH EFFICIENCY ORGANIC PHOTOVOLTAIC CELLS

(75) Inventors: Barry Rand, Princeton, NJ (US); Stephen R. Forrest, Ann Arbor, MI (US); Diana Pendergrast Burk, Washington, DC (US)

(73) Assignees: The Regents of the University of Michigan, Ann Arbor, MI (US); The Trustees of Princeton University, Princeton, NJ (US)

( * ) Notice: Subject to any disclaimer, the term of this patent is extended or adjusted under 35 U.S.C. 154(b) by 2161 days.

(21) Appl. No.: 11/486,163

(22) Filed: Jul. 14, 2006

(65) Prior Publication Data
US 2013/0255758 A1 Oct. 3, 2013

(51) Int. Cl.
*H01L 31/0256* (2006.01)
*H01L 51/42* (2006.01)
(Continued)

(52) U.S. Cl.
CPC ............ *H01L 51/4246* (2013.01); *B82Y 10/00* (2013.01); *H01L 27/302* (2013.01);
(Continued)

(58) Field of Classification Search
USPC ................. 136/263, 252; 438/82, 99, 57; 257/E51.017, E51.012
See application file for complete search history.

(56) References Cited

U.S. PATENT DOCUMENTS 5,703,436 A 12/1997 Forrest et al.
6,097,147 A 8/2000 Baldo et al.
(Continued)

FOREIGN PATENT DOCUMENTS

DE 198 54 938 6/2000
KR 10-2006-0048920 5/2006
(Continued)

OTHER PUBLICATIONS

Ot. E. Sielcken, et al, "Synthesis and Aggregation Behavior of Hosts Containing Phthalocyanine and Crown Either Subunits", J. Am. Chem. Soc., 109, pp. 4261-4265 (1987).
(Continued)

*Primary Examiner* — Golam Mowla
(74) *Attorney, Agent, or Firm* — Duane Morris LLP

(57) ABSTRACT

An organic photovoltaic cell includes an anode and a cathode, and a plurality of organic semiconductor layers between the anode and the cathode. At least one of the anode and the cathode is transparent. Each two adjacent layers of the plurality of organic semiconductor layers are in direct contact. The plurality of organic semiconductor layers includes an intermediate layer consisting essentially of a photoconductive material, and two sets of at least three layers. A first set of at least three layers is between the intermediate layer and the anode. Each layer of the first set consists essentially of a different organic semiconductor material having a higher LUMO and a higher HOMO, relative to the material of an adjacent layer of the plurality of organic semiconductor layers closer to the cathode. A second set of at least three layers is between the intermediate layer and the cathode. Each layer of the second set consists essentially of a different organic semiconductor material having a lower LUMO and a lower HOMO, relative to the material of an adjacent layer of the plurality of organic semiconductor layers closer to the anode.

20 Claims, 5 Drawing Sheets

(51) Int. Cl.
*B82Y 10/00* (2011.01)
*H01L 27/30* (2006.01)
*H01L 51/00* (2006.01)

(52) U.S. Cl.
CPC ......... *H01L51/4253* (2013.01); *H01L 51/0046* (2013.01); *H01L 51/0071* (2013.01); *H01L 51/0072* (2013.01); *H01L 51/0078* (2013.01); *Y02E 10/549* (2013.01)
USPC ............... 136/263; 136/252; 438/82; 438/57; 438/99; 257/E51.017; 257/E51.012

(56) References Cited

U.S. PATENT DOCUMENTS

| | | | |
|---|---|---|---|
| 6,333,458 | B1 | 12/2001 | Forrest et al. |
| 6,352,777 | B1 | 3/2002 | Bulovic et al. |
| 6,420,031 | B1 | 7/2002 | Parthasarathy et al. |
| 6,440,769 | B2 | 8/2002 | Peumans et al. |
| 6,451,415 | B1 | 9/2002 | Forrest et al. |
| 6,580,027 | B2 | 6/2003 | Forrest et al. |
| 6,657,378 | B2 | 12/2003 | Forrest et al. |
| 6,670,213 | B2 | 12/2003 | Halls et al. |
| 6,972,431 | B2 | 12/2005 | Forrest et al. |
| 6,995,445 | B2 | 2/2006 | Forrest et al. |
| 7,026,041 | B2 | 4/2006 | Forrest et al. |
| 2003/0042846 | A1 | 3/2003 | Forrest et al. |
| 2004/0197546 | A1 | 10/2004 | Rinzler et al. |
| 2005/0098726 | A1* | 5/2005 | Peumans et al. ........... 250/338.1 |
| 2005/0110005 | A1 | 5/2005 | Forrest et al. |
| 2005/0110007 | A1 | 5/2005 | Forrest et al. |
| 2005/0156197 | A1 | 7/2005 | Tsutsui et al. |
| 2005/0224113 | A1 | 10/2005 | Xue et al. |
| 2005/0224905 | A1 | 10/2005 | Forrest |
| 2005/0227406 | A1 | 10/2005 | Shtein et al. |
| 2005/0266218 | A1 | 12/2005 | Peumans et al. |
| 2006/0027802 | A1 | 2/2006 | Forrest et al. |
| 2006/0027834 | A1 | 2/2006 | Forrest et al. |
| 2006/0032529 | A1 | 2/2006 | Rand et al. |
| 2006/0289882 | A1 | 12/2006 | Nishimura et al. |
| 2007/0063156 | A1 | 3/2007 | Hayashi |

FOREIGN PATENT DOCUMENTS

| | | |
|---|---|---|
| WO | 2004025705 | 3/2004 |
| WO | 2005109542 A1 | 11/2005 |
| WO | 2006017530 A1 | 2/2006 |
| WO | 2006060017 A1 | 6/2006 |
| WO | 2007004758 | 1/2007 |

OTHER PUBLICATIONS

Bulovic V., et al, "Study of localized and extended excitons in 3,4,9. 10-perylenetetracarboxylic dianhydride (PTCDA) II. Photocurrent response at low electric fields", Chem. Phys. 210, pp. 13-25, 1996.
Gregg, B. A. et al, "Long-Range singlet energy transfer in perylene Bis(phenethylimide) films", J. Phys. Chem. B, 101, pp. 5362-5369, 1997.
Stubinger, T., et al, "Exciton diffusion and optical interference in organic donor-acceptor photovoltaic cells", J. Appl. Phys., vol. 90, No. 7, pp. 3632-3641, Oct. 1, 2001.
Kerp, et al, "Photovoltaic yield from exciton dissociation in organic dye layers", Phys. Chem. Chem Phys., 1999, 1, pp. 171-1763.
Pettersson et al, "Modeling photocurrent action spectra of photovoltaic devices based on organic thin films", J. Appl. Phys., vol. 86, No. 1, pp. 487-496, Jul. 1, 1999.
Burin, A. L., et al., "Exciton migration and cathode quenching in organic light emitting diodes", J. Phys. Chem. A, 104, pp. 4704-4710, 2000.
Choong, V. E., et al, "Photoluminexcence quenching of Alq3 by metal deposition: A surface analytical investigation", J. Vac. Sci. Technol. A 16(3), pp. 1838-1841, May/Jun. 1998.
Halls, J.J.M., et al "Exciton diffusion and dissociation in a poly(p-phenylenevinylene)/C60 heterojunction photovoltaic cell", Appl. Phys. Lett. 68(22), pp. 3120-3122, May 27, 1996.
Theander M., et al, "Photoluminescence quenching at a polythiophene/C60 heterojunction", Phys. Rev. B., vol. 61, No. 19, pp. 12 957-12 963, May 15, 2000.
Peumans P., et al, "Influence of Device Architecture and Interface Morphology on the Power Conversion Efficiency of Small Molecular Photovoltic Cells", NCPV and Solar Program Review Meting 2003, pp. 435-437.
Pradhan et al, "Molecular level control of donor/acceptor heterostructures in organic photovoltaic devices", Applied Physicis Letters, vol. 85, No. 4, pp. 663-665 (Jul. 26, 2004).
International Search Report dated Jan. 2, 2006, Application No. PCTUS2005/027478.
Peumans et al, "Efficient Photon Harvesting at High Optical Intensities in Ultrathin Organic Double-Heterostructure Photovoltaic Diodes", Applied Physics Letters, vol. 76, pp. 2650-2652 (2000).
Xue, J., et al "A hybrid planar-mixed molecular heterojunction photovoltaic cell".
Halls, et al, "Efficient photodiodes from interpenetrating polymer networks", Nature (London), vol. 376, No. 6540, pp. 498-500 (Aug. 10, 1995).
Uchida et al, "Organic Small Molecular Solar Cells with a Homogenously Mixed Cooper Phthalocyanine: C60 Active Layer", Appl. Phys. Lett., vol. 84, pp. 4218 (2004).
Xue Jiangent et al, "Asymmetric tandem organic photovoltaic cells with hybrid planar-mixed molecular heterojunctions", Appl. Phys. Lett., vol. 85, No. 23, pp. 5757-5759, Dec. 6, 2004.
<http://www.oksolar.com/solar_panels/unisolar_flexibles.htm>, "Uni-solar Flexible (USF) Unbreakable Solar Panels—Triple Junction", printed Sep. 14, 2004.
Nuesch et al., "Interface modification to optimize charge separation in cyanine heterojunction photovoltaic devices", Solar Energy Materials & Solar Cells 87(1-4): 817-824, 2005.
Maennig et al., "Organic P-I-N solar cells", Appl. Phys. A.: Materials Science and Processing A79(1): 1-14, 2004.
Dreschsel et al., "MIP-type organic solar cells incorporating phthalocyanine/fullerene mixed layers and doped wide-gap transport layers", Organic Electronics 5(4): 175-186, 2004.
Dreschsel et al., "High efficiency organic solar cells based on single or multiple PIN structures", Thin Solid Films 451-452: 515-517, 2004.
Gebeyehu et al., "Bulk-heterojunction photovoltaic devices based on donor-acceptor organic small molecule blends", Solar Energy Materials and Solar Cells 79(1): 81-92, 2003.
Wuerfel, "Physik der solarzellen", Spektrum Akademischer Verlag, pp. 102-103 and 144-146, 2000.*
International Search Report dated Dec. 14, 2007, International Application No. PCT/US2007/015967.
K. Ryu et al, "Transparent, Conductive and Flexible Carbon Nanotube Films and Their Application in Organic Light Emitting Diodes," Mater. Res. Soc. Symp. Proc., vol. 936, No. L04-04 (Apr. 17, 2006).
Zhou Yangxin et al, "A Method of Printing Carbon Nanotube Thin Films," Applied Physics Letters, AIP, American Institute of Physics, Melville, NY, vol. 88, No. 12 (Mar. 22, 2006).
Wu Z et al., "Transparent, Conductive Carbon Nanotube Films," Science, American Association for the Advancement of Science, US, Washington, DC, vol. 305, No. 5688 (Aug. 27, 2004).
Minami N. et al., "Optical Properties of Semiconducting and Metallic Single Wall Carbon Nanotubes: Effects of Doping and High Pressure," Synthetic Metals, Elsevier Sequoia, Lausanne, CH, vol. 116 (Jan. 1, 2001).
International Search Report dated Oct. 12, 2008, International Application No. PCT/US2007/016334.
Peumans et al., "Efficient photon harvesting at high optical intensities in ultrathin organic double-heterostructure photovoltaic diodes", Appl. Phys. Lett. 76: 2650-2652, 2000.
Miessler et al., "Inorganic Chemistry", 2$^{nd}$ Edition, Prentice Hall, Chapter 13, 1999.

(56) References Cited

OTHER PUBLICATIONS

Scharber et al., "Design rules for donors in bulk-heterojunction solar cells—toards 10% energy conversion efficiency", Adv. Mater. 18: 789-794, 2006.

Koster et al., "Ultimate efficiency of polymer/fullerene bulk heterojunction solar cells", Appl. Phys. Lett. 88: 093511, 2006.

Turro, "Modern molecular photochemistry", Chapter 5, University Science Books, pp. 76-152, 1991.

Peumans et al, "Small Molecular Weight Organic Thin-Film Photodetectors and Solar Cells", Journal of Applied Physics, vol. 93, No. 7, pp. 3693-3723 (Apr. 1, 2003).

Tang, C.W., "Two-layer organic photovoltaic cell", Appl. Phys. Lett., vol. 48, No. 2, pp. 183-185 (Jan. 1986).

Yakimov, A., et al "High photovoltage multiple-heterojunction organic solar cells incorporating interfacial metallic nanoclusters", Appl. Phys. Lett., vol. 80, No. 9, pp. 1667-1669 (Mar. 4, 2002).

Peumans P., et al "Very-high-efficiency double-heterostructure copper phthalocyanine/C60 photovoltaic cells", Appl. Phys. Lett, vol. 79, No. 1, pp. 126-128 (Jul. 2, 2001).

Shaheen, S.E. et al, "2.5% efficient organic plastic solar cells", Appl. Phys. Lett., vol. 78, No. 6, pp. 841-843 (Feb. 5, 2001).

Peumans P. et al, "Efficient bulk heterojunction photovoltaic cells using small-molecular-weight organic thin films", Nature, vol. 425, pp. 158-162 (Sep. 11, 2003).

Xue et al, "4.2% efficient organic photovoltaic cells with low series resistances", Appl. Phys. Lett., vol. 84, No. 16, pp. 3013-3015 (Apr. 19, 2004).

Hiramoto M., et al, "Three-layered organic solar cell with a photoactive interlayer of codeposited pigments", Appl. Phys. Lett. 58 (10), pp. 1062-1064 (Mar. 11, 1991).

Forrest, "Ultrathin Organic Films Grown by Molecular Beam Deposition and Related Techniques", Chem Rev., Vo. 97, No. 6, pp. 1793-1896 (1997).

Sullivan, et al, "Influence of codeposition on the performance of CuPc-C60 heterojunction photovoltaic devices", Appl. Phys. Lett., vol. 84, No. 7, pp. 1210-1212 (Feb. 16, 2004).

Burrows et al, "Relationship between electroluminescence and current transport in organic heterojunction light-emitting devices", J. Appl. Phys. 79(10), pp. 7991-8006 (May 15, 1996).

Xue et al, "Carrier transport in multilayer organic photodetectors: II. Effects of anode preparation", J. Appl. Phys., vol. 95, No. 4, pp. 1869-1877 (Feb. 15, 2004).

Paasch et al, "Variable range hopping as posible origin of a universal relation between conductivity and mobility in disordered organic semiconductors", Synthetic Metals, 132 pp. 97-104 (2002).

Ruani G., et al, "Weak instrinsic charge transfer complexes: A new route for developing wide spectrum organic photovoltaic cells", J. Chem Phys., vol. 116, No. 4, pp. 1713-1719 (Jan. 22, 2002).

Hiramoto, M. et al, "p-i-n like behavior in three-layered organic solar cells having a co-deposited interlayer of pigments", J. Appl. Phys., 72(8), pp. 3781-3787, Oct. 15, 1992.

Yu, G., et al, "Polymer Photovoltaic Cells: Enhanced efficiencies via a network of internal donor-acceptor heterojunctions", Science, vol. 270, pp. 1789-1791 (Dec. 15, 1995).

Padinger, F., et al, "Effects of postproduction treatment on plastic solar cells", Adv. Funct. Mater., 13, No. 1, pp. 85-88 (Jan. 2003).

Tsuzuki T., et al, "The effect of fullerene doping on photoelectric onversion using titanyl phthalocyanine and a perylene pigment", Solar Energy Mater. Solar Cells, 61, pp. 1-8 (2000).

Rostalski J., et al, "Monochromatic versus solar efficiencies of organic solar cells", Solar Energy Mater. Solar Cells, 61, pp. 87-95 (2000).

Ch. Panemann, et al, "Electrical characterisation of phthalocyanine-fullerene photovoltaic devices" Synth. Met., 121 pp. 1585-1586 (2001).

<http://ww.uni-solar.com/Our_Technology_a_Si.html>, "Amorphous Silicon (a-Si) Solar Technology" printed from United Solar Ovonic Corp. website on Sep. 14, 2004.

Guha, S., et al "Amorphous Silicon Alloy Photovoltaic Research Present and Future", Progress in Photovoltaics: Research and Applications, Prog. Photovolt. Res. Appl. 8, pp. 141-150 (2000).

<http://www.oksolar.com/pdf/solar_energy_catalog/unisolar_us-64.pdf>, "Uni-Power Solar Electric Modules Specification Sheet, Models US-64, US-42, US-32", printed from the OKSolar.com website on Sep. 14, 2004.

Foreign Office Action issued in connection with Japanese Patent Application No. 2009-519542, Based on International Application No. PCT/US2007/015967, dated Feb. 5, 2013.

Copy of Official Action issued Oct. 11, 2013 in counterpart KR Patent Application No. 10-2009-7002070.

Examiners Report issued on Sep. 3, 2013 in counterpart CA Application No.: 2,657,672.

Hiramoto, Masahiro et al., Organic solar cell based on multistep charge separation system, Appl. Phys. Lett., vol. 61, No. 21, 23, Nov. 1992, pgs. 2580-2582.

Official Action issued Jul. 29, 2014 in counterpart CA Patent Application No. 2,657,672.

* cited by examiner

ARCHITECTURES AND CRITERIA FOR THE DESIGN OF HIGH EFFICIENCY ORGANIC PHOTOVOLTAIC CELLS

UNITED STATES GOVERNMENT RIGHTS

This invention was made with U.S. Government support under Grant No. 339 1012 DE-AC36-98-GO10337 and subcontract XAT 5-33636-03 awarded by U.S. Department of Energy, National Renewable Energy Laboratory. The government has certain rights in this invention.

JOINT RESEARCH AGREEMENT

The claimed invention was made by, on behalf of, and/or in connection with one or more of the following parties to a joint university-corporation research agreement: Regents of the University of Michigan, Princeton University, University of Southern California, Universal Display Corporation, and Global Photonic Energy Corporation. The agreement was in effect on and before the date the claimed invention was made, and the claimed invention was made as a result of activities undertaken within the scope of the agreement.

FIELD OF THE INVENTION

The present invention generally relates to organic photosensitive opto-electronic devices. More specifically, it is directed to organic photosensitive optoelectronic devices utilizing an energy cascade to spatially dissociate photogenerated excitons.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. As used herein, "top" means furthest away from the substrate, while "bottom" means closest to the substrate. There may be intervening layers (for example, if a first layer is "on" or "over" a second layer), unless it is specified that the first layer is "in physical contact with" or "directly on" the second layer; however, this does not preclude surface treatments (e.g., exposure of the first layer to hydrogen plasma).

When electromagnetic radiation of an appropriate energy is incident upon an organic semiconductor material, a photon can be absorbed to produce an excited molecular state. In organic photoconductive materials, the generated molecular state is generally believed to be an "exciton," i.e., an electron-hole pair in a bound state which is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron-hole forming the exciton are typically separated at a rectifying junction.

In the case of photosensitive devices, the rectifying junction is referred to as a photovoltaic heterojunction. Types of organic photovoltaic heterojunctions include a donor-acceptor heterojunction formed at an interface of a donor material and an acceptor material, and a Schottky-barrier heterojunction formed at the interface of a photoconductive material and a metal.

FIG. 1 is an energy-level diagram illustrating an example donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

After absorption of a photon 6 in the donor 152 or the acceptor 154 creates an exciton 8, the exciton 8 dissociates at the rectifying interface. The donor 152 transports the hole (open circle) and the acceptor 154 transports the electron (dark circle).

A significant property in organic semiconductors is carrier mobility. Mobility measures the ease with which a charge carrier can move through a conducting material in response to an electric field. In the context of organic photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

A figure of merit for PV devices is the fill factor, ff, defined as:

$$ff = \{I_{max}V_{MAX}\}/\{I_{SC}V_{OC}\}$$

where ff is always less than 1, as the short-circuit current $I_{SC}$ and the open circuit voltage $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = ff * (I_{SC} * V_{OC})/P_{inc}$$

The power efficiency of an organic PV device, $\eta_P$, depends on the various processes required for photoconduction, including exciton generation, diffusion, and ionization or collection. There is an efficiency $\eta$ associated with each of these processes. Subscripts may be used as follows: P for power efficiency, EXT for external quantum efficiency, A for photon absorption, ED for exciton diffusion, CC for charge collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

For additional background explanation and description of the state of the art for organic photosensitive devices, including their general construction, characteristics, materials, and features, U.S. Pat. No. 6,657,378 to Forrest et al., U.S. Pat. No. 6,580,027 to Forrest et al., and U.S. Pat. No. 6,352,777 to Bulovic et al. are incorporated herein by reference.

SUMMARY OF THE INVENTION

An example of an organic photovoltaic cell making use of the new architecture disclosed herein includes an anode and a cathode, and a plurality of organic semiconductor layers between the anode and the cathode. At least one of the anode and the cathode is transparent. Each two adjacent layers of the plurality of organic semiconductor layers are in direct contact. The plurality of organic semiconductor layers includes an intermediate layer consisting essentially of a photoconductive material, and two sets of at least three layers. A first set of at least three layers is between the intermediate layer and the anode. Each layer of the first set consists essentially of a different organic semiconductor material having a higher LUMO and a higher HOMO, relative to the material of an adjacent layer of the plurality of organic semiconductor layers closer to the cathode. A second set of at least three layers is between the intermediate layer and the cathode. Each layer of the second set consists essentially of a different organic semiconductor material having a lower LUMO and a lower HOMO, relative to the material of an adjacent layer of the plurality of organic semiconductor layers closer to the anode.

Preferably, an energy difference between a HOMO of a layer closest to the anode of the first set and a LUMO of a layer of the second set closest to the cathode is between 0.5 eV and 3.0 eV, larger difference may be possible as materials become available. Thus, more preferably, the energy difference is at least 1 eV.

An organic semiconductor material of each layer of the first set of at least three layers preferably has a HOMO and a LUMO that is at least 0.026 eV higher relative to the material of an adjacent layer of the plurality of organic semiconductor layers closer to the cathode. Likewise, an organic semiconductor material of each layer of the second set of at least three layers preferably has a HOMO and a LUMO that is at least 0.026 eV lower relative to the material of an adjacent layer of the plurality of organic semiconductor layers closer to the anode.

A combined sum of the HOMO differences between adjacent layers consisting of the first set of at least three layers and the intermediate layer, and the LUMO differences between adjacent layers consisting of the second set of at least three layers and the intermediate layer, is preferably between 0.15 eV and 1.0 eV.

A combined sum of the HOMO differences between adjacent layers consisting of the first set of at least three layers and the intermediate layer, and the LUMO differences between adjacent layers consisting of the second set of at least three layers and the intermediate layer, divided by a sum of the number of layers in the first set and the second set, is preferably at least 0.026 eV.

As another expression of the preferred average step size, a sum of the HOMO differences between adjacent layers consisting of the first set of at least three layers and the intermediate layer divided by the number of layers in the first set is preferably at least 0.026 eV, and a sum of the LUMO differences between adjacent layers consisting of the second set of at least three layers and the intermediate layer divided by the number of layers in the second set, is preferably at least 0.026 eV.

The organic semiconductor materials of the first set and the second set may or may not be photoconductive materials. Preferably, they are photoconductive.

A layer of the first set of three layers adjacent to said intermediate layer and a layer of the second set of three layers adjacent to said intermediate layer are preferably each no more than three monolayers thick of the respective organic semiconductor material. As one example of layer thickness arrangements, each layer of the first set and the second set is preferably no more than three monolayers thick of the respective organic semiconductor material. As another example of layer thickness arrangements, layer thicknesses of the first set of at least three layers progressively increase toward the anode, and the layer thicknesses of the second set of at least three layers progressively increase toward the cathode. If a progression of layer thickness is used, it preferred that a layer of the first set of at least three layers closest to the anode and a layer of the second set of at least three layer closest to the cathode are no more than ten monolayers thick.

The layers can be arranged so that material bandgaps of the first set of at least three layers progressively increase toward the anode. This can be particularly advantageous if the anode is reflective. If the anode is reflective, it is also preferred that the largest material bandgap of the second set of at least three layers is smaller than smallest material bandgap of the first set of materials.

The layers can be arranged so that material bandgaps of the second set of at least three layers progressively increase toward the cathode. This can be particularly advantageous if the cathode is reflective. If the cathode is reflective, it is also preferred that the largest material bandgap of the first set of at least three layers is smaller than smallest material bandgap of the second set of materials.

The photoconductive material of the intermediate layer may consist essentially (among other things) of molecules that form an excimer or an exciplex in an excited state. If such a molecular complex is used, the relevant HOMO and LUMO of the photoconductive material of the intermediate layer is that of the excimer or exciplex, which is usually different from the HOMO and LUMO of the constituent molecules. Thus, with a molecular complex, a LUMO and a HOMO of a layer of the first set of at least three layers adjacent to the intermediate layer are higher relative to the molecular complex, and a LUMO and a HOMO of a layer of the second set of at least three layers adjacent to the intermediate layer are lower relative to the molecular complex.

An example of a method for fabricating the photosensitive device making use of the new architecture disclosed herein includes providing a first electrode; depositing a series of at least seven layers onto the first electrode, each layer consisting essentially of a different organic semiconductor material, the organic semiconductor material of at least an intermediate layer of the sequence being a photoconductive material; and depositing a second electrode onto the sequence of at least seven layers. One of the first electrode and the second electrode is an anode and the other is a cathode. The organic semiconductor materials of the series of at least seven layers are arranged to provide a sequence of decreasing LUMOs and a sequence of decreasing HOMOs across the series from the anode to the cathode.

An energy difference between a HOMO of the organic semiconductor material of the layer of the series of at least seven layers closest to the anode and a LUMO of the organic semiconductor material of the layer of the series of at least seven layers closest to the cathode is preferably between 0.5 eV and 3.0 eV, and is more preferably, the energy difference is at least 1 eV.

An example of a method of providing photocurrent to a load in accordance with the new architecture disclosed herein may include providing a series of layers of different organic semiconductor materials between an anode and a cathode, the series of layers arranged to simulate a built-in field at thermal equilibrium between the anode and the cathode; generating an exciton by photoabsorption within an intermediate layer of the series of layers; spatially dissociating the exciton generated within an intermediate layer, the simulated built-in field attracting a bound electron of the exciton from the intermediate layer into one or more of the series layers toward the cathode, while attracting a bound hole of the exciton from the intermediate layer into one or more of the plurality of the organic semiconductor layers toward the anode; and applying photocurrent from the spatially dissociated exciton to a load electrically connected from the anode to the cathode. An open-circuit voltage across the anode and the cathode is preferably at least one volt.

The figures are not necessarily drawn to scale.

DETAILED DESCRIPTION

Figure 2:
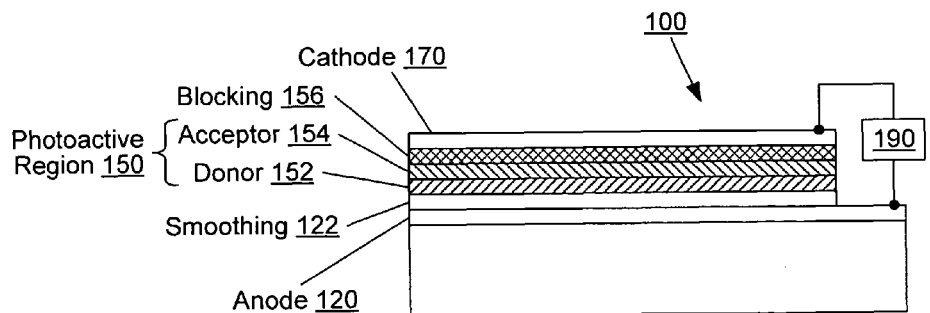
FIG. 2 illustrates an organic photosensitive device including a donor-acceptor heterojunction.

An organic photosensitive device comprises at least one photoactive region in which light is absorbed to form an exciton, which may subsequently dissociate into an electron and a hole. FIG. 2 shows an example of an organic photosensitive optoelectronic device 100 in which the photoactive region 150 comprises a donor-acceptor heterojunction. The "photoactive region" is a portion of a photosensitive device that absorbs electromagnetic radiation to generate excitons that may dissociate in order to generate an electrical current. Device 100 comprises an anode 120, an anode smoothing layer 122, a donor 152, an acceptor 154, an exciton blocking layer ("EBL") 156, and a cathode 170, over a substrate 110.

Examples of EBL 156 are described in U.S. Pat. No. 6,451,415 to Forrest et al., which is incorporated herein by reference for its disclosure related to EBLs. Additional background explanation of EBLs may also be found in Peumans et al., "Efficient photon harvesting at high optical intensities in ultrathin organic double-heterostructure photovoltaic diodes," *Applied Physics Letters* 76, 2650-52 (2000). EBLs reduce quenching by preventing excitons from migrating out of the donor and/or acceptor materials.

The terms "electrode" and "contact" are used interchangeably herein to refer to a layer that provides a medium for delivering photo-generated current to an external circuit or providing a bias current or voltage to the device. As illustrated in FIG. 2, anode 120 and cathode 170 are examples. Electrodes may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity, such as doped wide-bandgap semiconductors, degenerate semiconductors, conducting oxides, and conductive polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50% of the ambient electromagnetic radiation in a relevant wavelength.

The substrate 110 may be any suitable substrate that provides desired structural properties. The substrate may be flexible or rigid, planar or non-planar. The substrate may be transparent, translucent or opaque. Rigid plastics and glass are examples of preferred rigid substrate materials. Flexible plastics and metal foils are examples of preferred flexible substrate materials.

An anode-smoothing layer 122 may be situated between the anode layer 120 and the donor layer 152. Anode-smoothing layers are described in U.S. Pat. No. 6,657,378 to Forrest et al., incorporated herein by reference for its disclosure related to this feature.

In FIG. 2, the photoactive region 150 comprises the donor material 152 and the acceptor material 154. Organic materials for use in the photoactive region may include organometallic compounds, including cyclometallated organometallic compounds. The term "organometallic" as used herein is as generally understood by one of ordinary skill in the art and as given, for example, in Chapter 13 of "Inorganic Chemistry" (2nd Edition) by Gary L. Miessler and Donald A. Tarr, Prentice Hall (1999).

Organic layers may be fabricated using vacuum deposition, spin coating, organic vapor-phase deposition, inkjet printing and other methods known in the art.

Figure 3:
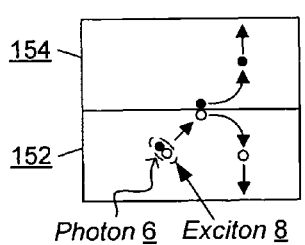
FIG. 3 illustrates a donor-acceptor bilayer forming a planar heterojunction.
Figure 4:
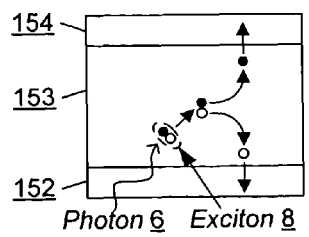
FIG. 4 illustrates a hybrid heterojunction including a mixed heterojunction between a donor layer and an acceptor layer.
Figure 5:
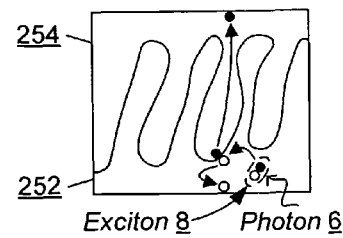
FIG. 5 illustrates a bulk heterojunction.

Examples of various types of donor-acceptor heterojunctions are shown in FIGS. 3-5. FIG. 3 illustrates a donor-acceptor bilayer forming a planar heterojunction. FIG. 4 illustrates a hybrid heterojunction including a mixed heterojunction 153 comprising a mixture of donor and acceptor materials. FIG. 5 illustrates an idealized "bulk" heterojunction. A bulk heterojunction, in the ideal photocurrent case, has a single continuous interface between the donor material 252 and the acceptor material 254, although multiple interfaces typically exist in actual devices. Mixed and bulk heterojunctions can have multiple donor-acceptor interfaces as a result of having plural domains of material. Domains that are surrounded by the opposite-type material (e.g., a domain of donor material surrounded by acceptor material) may be electrically isolated, such that these domains do not contribute to photocurrent. Other domains may be connected by percolation pathways (continuous photocurrent pathways), such that these other domains may contribute to photocurrent. The distinction between a mixed and a bulk heterojunction lies in degrees of phase separation between donor and acceptor materials. In a mixed heterojunction, there is very little or no phase separation (the domains are very small, e.g., less than a few nanometers), whereas in a bulk heterojunction, there is significant phase separation (e.g., forming domains with sizes of a few nanometers to 100 nm).

Small-molecule mixed heterojunctions may be formed, for example, by co-deposition of the donor and acceptor materials using vacuum deposition or vapor deposition. Small-molecule bulk heterojunctions may be formed, for example, by controlled growth, co-deposition with post-deposition annealing, or solution processing. Polymer mixed or bulk heterojunctions may be formed, for example, by solution processing of polymer blends of donor and acceptor materials.

If a photoactive region includes a mixed layer (153) or bulk layers (252, 254) and one or both of the donor (152) and acceptor layers (154), the photoactive region is said to include a "hybrid" heterojunction. The arrangement of layers in FIG. 4 is an example. For additional explanation of hybrid heterojunctions, Published U.S. Patent Application 2005/0224113 A1, entitled "High efficiency organic photovoltaic cells employing hybridized mixed-planar heterojunctions" by Jiangeng Xue et al., published Oct. 13, 2005, is hereby incorporated by reference.

In general, planar heterojunctions have good carrier conduction, but poor exciton dissociation; a mixed layer has poor carrier conduction and good exciton dissociation, and a bulk heterojunction has good carrier conduction and good exciton dissociation, but may experience charge build-up at the end of the material "cul-de-sacs," lowering efficiency. Unless otherwise stated, planar, mixed, bulk, and hybrid heterojunctions may be used interchangeably as donor-acceptor heterojunctions throughout the embodiments disclosed herein.

Figure 6:
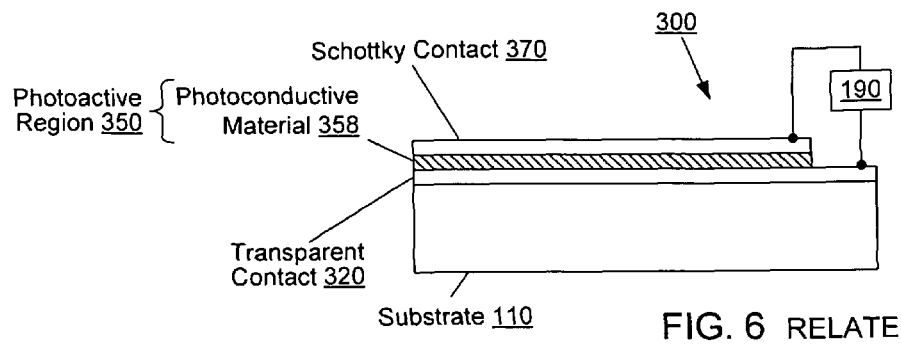
FIG. 6 illustrates an organic photosensitive device including a Schottky-barrier heterojunction.

FIG. 6 shows an example of a organic photosensitive optoelectronic device 300 in which the photoactive region 350 is part of a Schottky-barrier heterojunction. Device 300 comprises a transparent contact 320, a photoactive region 350 comprising an organic photoconductive material 358, and a Schottky contact 370. The Schottky contact 370 is typically formed as a metal layer. If the photoconductive layer 358 is an ETL, a high work function metal such as gold may be used, whereas if the photoconductive layer is an HTL, a low work function metal such as aluminum, magnesium, or indium may be used. In a Schottky-barrier cell, a built-in electric field associated with the Schottky barrier pulls the electron and hole in an exciton apart. Generally, this field-assisted exciton dissociation is not as efficient as the dissociation at a donor-acceptor interface.

The devices as illustrated may be connected to an element 190. If the device is a photovoltaic device, element 190 is a resistive load which consumes or stores power. If the device is a photodetector, element 190 is a current detecting circuit which measures the current generated when the photodetector is exposed to light, and which may apply a bias to the device (as described for example in Published U.S. Patent Application 2005-0110007 A1, published May 26, 2005 to Forrest et al.). If the rectifying junction is eliminated from the device (e.g., using a single photoconductive material as the photoactive region), the resulting structures may be used as a photoconductor cell, in which case the element 190 is a signal detection circuit to monitor changes in resistance across the device due to the absorption of light. Unless otherwise stated, each of these arrangements and modifications may be used for the devices in each of the drawings and embodiments disclosed herein.

An organic photosensitive optoelectronic device may also comprise transparent charge transfer layers, electrodes, or charge recombination zones. A charge transfer layer may be organic or inorganic, and may or may not be photoconductively active. A charge transfer layer is similar to an electrode, but does not have an electrical connection external to the device and only delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semi-transparent metal or metal substitute recombination centers comprising nanoclusters, nanoparticles, and/or nanorods, as described for example in U.S. Pat. No. 6,657,378 to Forrest et al.; Published U.S. Patent Application 2006-0032529 A1, entitled "Organic Photosensitive Devices" by Rand et al., published Feb. 16, 2006; and Published U.S. Patent Application 2006-0027802 A1, entitled "Stacked Organic Photosensitive Devices" by Forrest et al., published Feb. 9, 2006; each incorporated herein by reference for its disclosure of recombination zone materials and structures. A charge recombination zone may or may not include a transparent matrix layer in which the recombination centers are embedded. A charge transfer layer, electrode, or charge recombination zone may serve as a cathode and/or an anode of subsections of the opto-electronic device. An electrode or charge transfer layer may serve as a Schottky contact.

Figure 7:
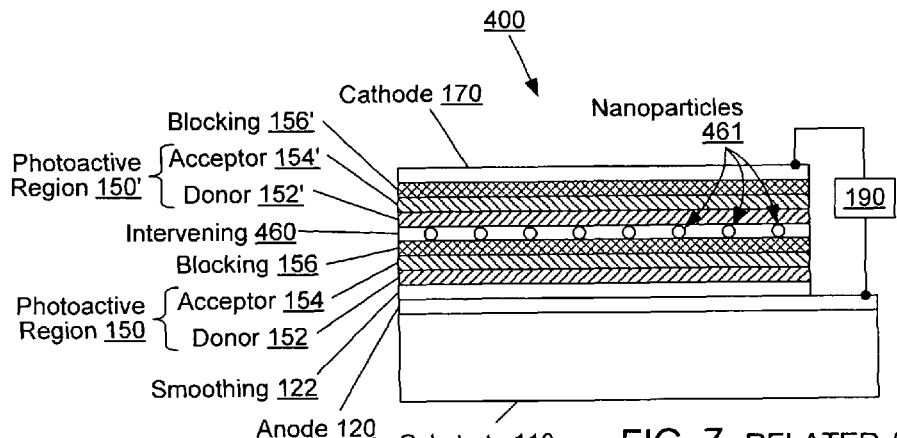
FIG. 7 illustrates tandem photosensitive cells in series.
Figure 8:
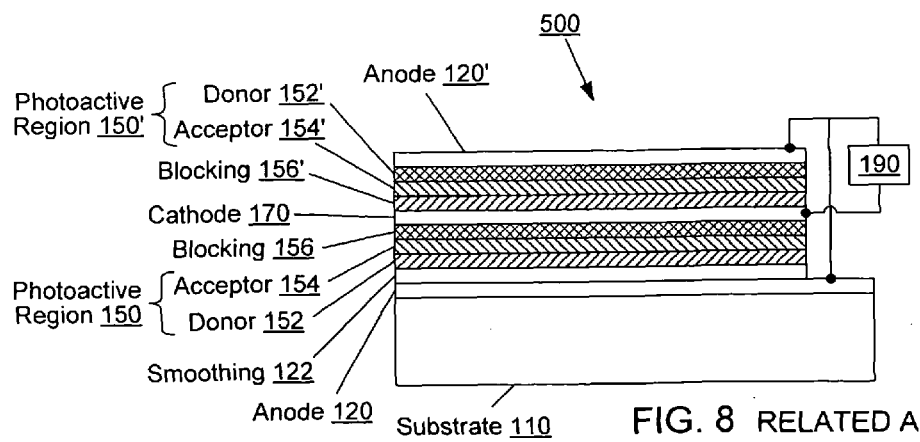
FIG. 8 illustrates tandem photosensitive cells in parallel.

FIGS. 7 and 8 illustrate examples of tandem devices including such transparent charge transfer layers, electrodes, and charge recombination zones. In device 400 in FIG. 7, photoactive regions 150 and 150' are stacked electrically in series with an intervening conductive region 460. As illustrated without external electrical connections, intervening conductive region 460 may be a charge recombination zone or may be a charge transfer layer. As a recombination zone, region 460 comprises recombination centers 461 with or without a transparent matrix layer. If there is no matrix layer, the arrangement of material forming the zone may not be continuous across the region 460. Device 500 in FIG. 8 illustrates photoactive regions 150 and 150' stacked electrically in parallel, with the top cell being in an inverted configuration (i.e., cathode-down). In each of FIGS. 7 and 8, the photoactive regions 150 and 150' and blocking layers 156 and 156' may be formed out of the same respective materials, or different materials, depending upon the application. Likewise, photoactive regions 150 and 150' may be a same type (i.e., planar, mixed, bulk, hybrid) of heterojunction, or may be of different types.

In each of the devices described above, layers may be omitted, such as the exciton blocking layers. Other layers may be added, such as reflective layers or additional photoactive regions. The order of layers may be altered or inverted. A concentrator or trapping configuration may be employed to increase efficiency, as disclosed, for example in U.S. Pat. No. 6,333,458 to Forrest et al. and U.S. Pat. No. 6,440,769 to Peumans et al., which are incorporated herein by reference. Coatings may be used to focus optical energy into desired regions of a device, as disclosed, for example in Published US Patent Application No. 2005-0266218 A1, entitled "Aperiodic dielectric multilayer stack" by Peumans et al., published Dec. 1, 2005, which is incorporated herein by reference. In the tandem devices, transparent insulative layers may be formed between cells, with the electrical connection between the cells being provided via electrodes. Also in the tandem devices, one or more of the photoactive regions may be a Schottky-barrier heterojunction instead of a donor-acceptor heterojunction. Arrangements other than those specifically described may be used.

Figure 1:
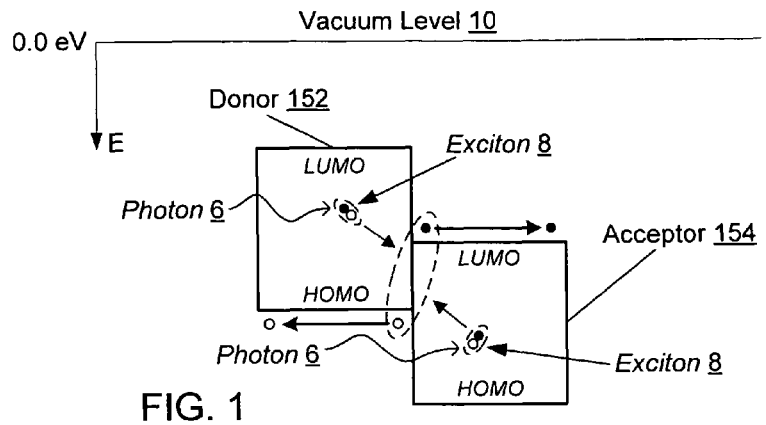
FIG. 1 is an energy level diagram illustrating a donor-acceptor heterojunction.

Conventional inorganic semiconductor photovoltaic cells employ a p-n junction to establish an internal field. As illustrated in FIG. 1, organic photovoltaic cells contain a donor-acceptor heterojunction analogous to that employed in a conventional inorganic photovoltataic cell. However, it is now recognized, that in addition to the establishment of a p-n type junction, the energy level offset of the heterojunction also plays an important role in organic devices.

Given the approximately proportional relationship between fill factor (ff) and external quantum efficiency ($\eta_{EXT}$) in organic photovoltaic devices, it has been necessary to balance short-circuit current density (JO with open-circuit voltage ($V_{OC}$) to maximize device performance.

Figure 9:
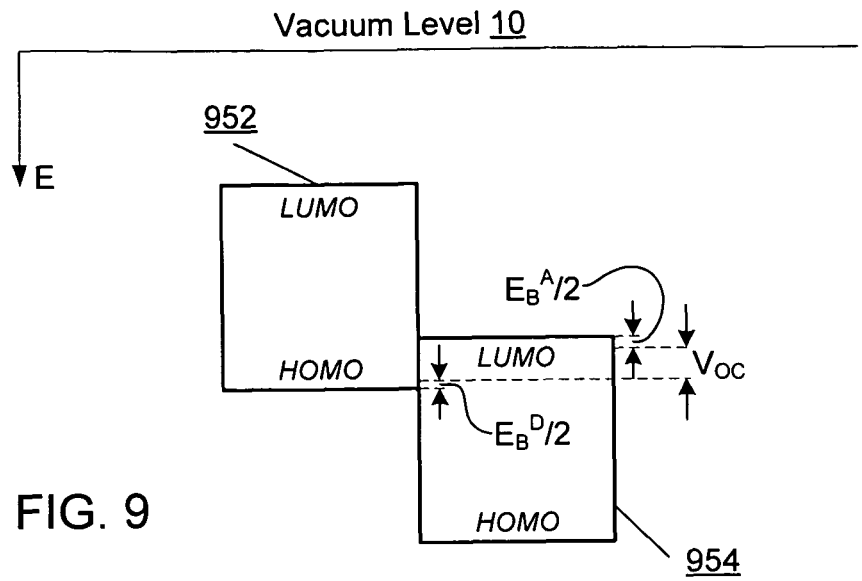
FIG. 9 illustrates a donor-acceptor heterojunction delivering high short-circuit current density but poor open-circuit voltage.
Figure 10:
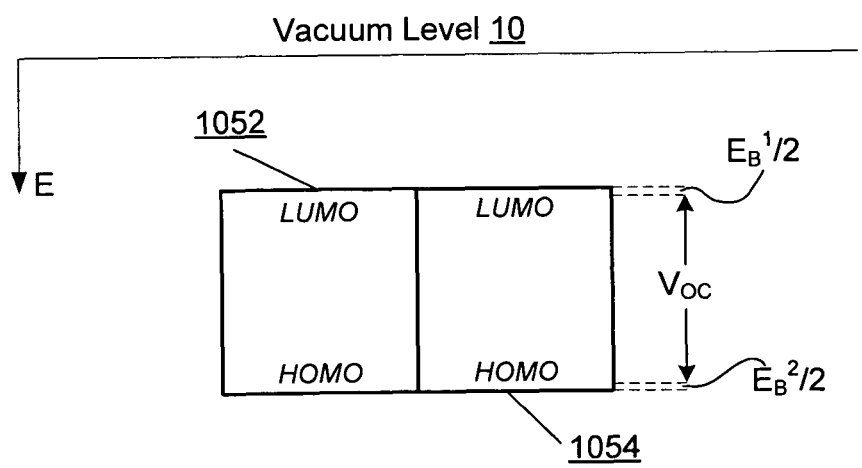
FIG. 10 illustrates a heterojunction delivering maximum open-circuit voltage, but zero short-circuit current density.

The problems associated with this balancing are illustrated in FIGS. 9 and 10. In FIG. 9, the large step between the donor 952 and the acceptor 954 results in a high short-circuit density, but a low open-circuit voltage. In comparison, the arrangement of materials in FIG. 10 illustrates the maximum open-circuit voltage in a structure producing zero short-circuit current density.

In an organic donor-acceptor heterojunction, the open-circuit voltage is equal to the HOMO of the donor minus the LUMO of the acceptor minus one-half of the exciton binding energy of each of the donor ($E_B^D$) and the acceptor ($E_B^A$) excitons. The sum of ½ of the exciton binding energies of the donor and acceptor has been empirically estimated to be around 0.3 to 0.4 eV. See Markus C. Scharber et al., "Design Rules for Donors in Bulk-Heterojunction Solar Cells—Towards 10% Energy Conversion Efficiency," *Advanced Materials* 18, 789-794 (2006); and L. J. A. Koster et al., "Ultimate efficiency of polymer/fullerene bulk heterojunction solar cells," *Applied Physics Letters* 88, 093511 (2006). In comparison, the exciton binding energies in inorganic semiconductor devices are much smaller, such that there is no appreciable open-circuit voltage penalty due to binding energy using a p-n junction structure. Therefore, to maximize the efficiency of organic photovoltaic cells (maximizing the open-circuit voltage and short-circuit current density) beyond the present theoretical limits, a new architecture is needed.

Disclosed herein is a new architecture for photosensitive devices that decouples the balancing previously required between the short-circuit current density and the open-circuit voltage, employing an energy-cascade process reminiscent of photosynthesis instead of a single p-n junction.

With classic donor-acceptor heterojunctions, as illustrated in FIG. 1, exciton dissociation depends upon the existence of a single rectifying junction to dissociate a photo-generated exciton (i.e., in a classic donor-acceptor heterojunction device, the device may include several rectifying junctions, but an individual exciton dissociates at only one interface). As presented herein, excitons can be spatially dissociated by structurally simulating a built-in field (at thermal equilibrium) across a series of layers of different organic semiconductor materials, attracting a bound electron of the exciton from an intermediate layer into one or more of a plurality of organic semiconductor layers toward the cathode, while attracting a bound hole of the exciton from the intermediate layer into one or more of a plurality of the organic semiconductor layers toward the anode. In essence, even if a reverse current is possible, the simulated field gradient rips the exciton apart across at least two spatially separated interfaces.

Figure 11:
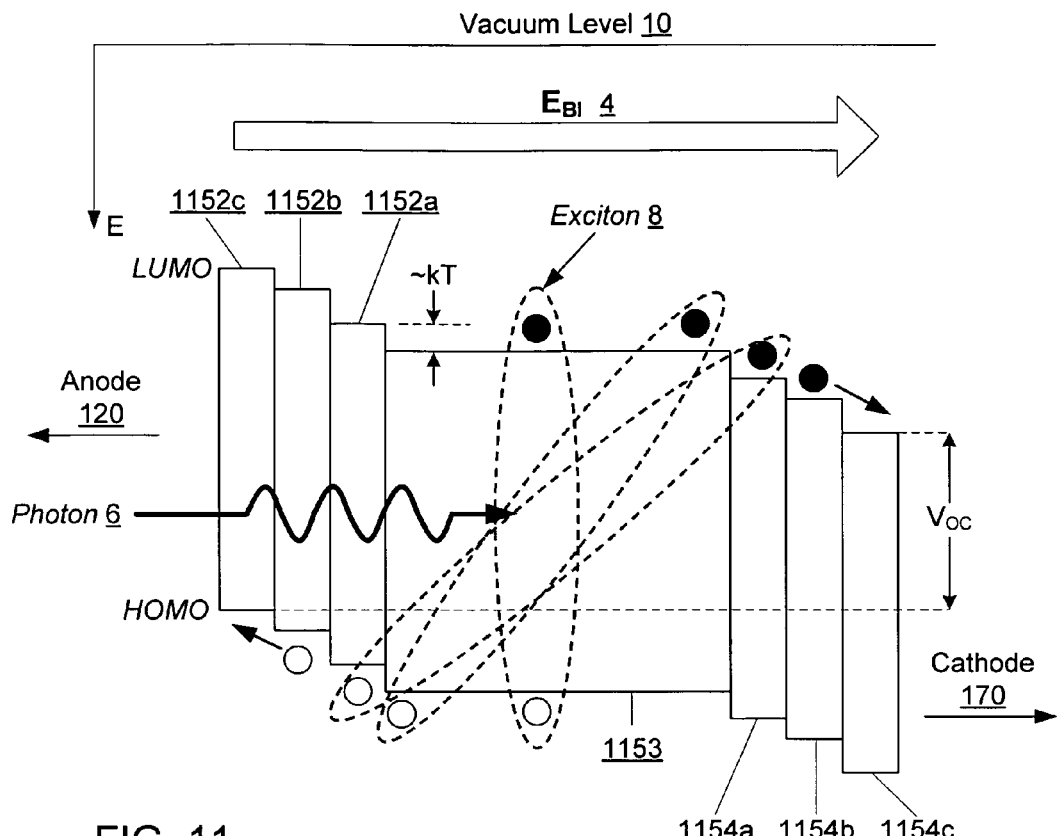
FIG. 11 illustrates an example of an energy cascade spatially dissociating a photogenerated exciton in accordance with the principles of the present invention.

FIG. 11 illustrates an energy-band diagram of the new structure composed of a series of layers of different organic semiconductor materials, each layer being in direct contact with a next layer. An intermediate layer 1153 consists essentially of a photoconductive semiconductor material. A first set (1152) of at least three organic semiconductor layers (1152*a*, 1152*b*, 1152*c*) are arranged between the intermediate layer 1153 and the anode 120, and a second set (1154) of at least three organic semiconductor layers (1154*a*, 1154*b*, 1154*c*) are arranged between the intermediate layer 1153 and the cathode 170. Each layer of the first set 1152 consists essentially of a different organic semiconductor material having a higher LUMO and a higher HOMO relative to the material of an adjacent layer of the plurality of organic semiconductor layers closer to the cathode. Each layer of the second set 1154 consists essentially of a different organic semiconductor material having a lower LUMO and a lower HOMO relative to the material of an adjacent layer of the plurality of organic semiconductor layers closer to the anode.

Preferably, the steps between HOMOs on the anode-side of the intermediate layer 153 are each between 1 kT and 3 kT, and the LUMOs on the cathode-side of the intermediate layer 153 are each also each between 1 kT and 3 kT. While such small steps are not necessarily rectifying (making reverse current possible), the steps simulate a built-in field ($E_{B1}$, 4) between the anode and the cathode if the first and second set of layers are kept relatively thin (a few monolayers, as described further below). In other words, a device in accordance with the new architecture can be both efficient and fully operable even if none of the interfaces between the first set of layers 1152, the intermediate layer 1153, and the second set of layers 1154 are rectifying. As illustrated in FIG. 11, the result of the new architecture is that an exciton 8 is spatially dissociated, simultaneously pulled apart across at least two separate boundary interfaces ("spatial dissociation").

The merits of this approach become clear when the open-circuit voltage ($V_{OC}$) is considered. The open circuit voltage is the difference between the HOMO of the layer of the first set 1152 closest to the anode and the LUMO of the layer of the second set 1154 closest to the cathode. As a result of the new structure, the exciton-binding energy of each end materials is removed as a factor. Accordingly, the open-circuit voltage can be as large as the energy gap of the intermediate layer 1153 minus 6 kT (6 kT corresponding to 6 steps of 1 kT each), while at the same time having a high current density. Open-circuit voltages exceeding 1 eV are readily obtainable, even if infrared-absorbing materials are included. The preferred open-circuit voltage range is between 0.5 eV and 3.0 eV, although a larger $V_{OC}$ should be possible as new organic semiconductor materials become available.

Having LUMO steps in the first set 1152 and HOMO steps in the second set 1154 of at least 1 kT (0.026 eV) is preferred because it is sufficient to create the simulated built-in electric field 4. Higher voltage-step differences are advantageous in that large steps increase the effect of the built-in electric field 4. However, an increase in the cumulative voltage difference across the cascade decreases the open-circuit voltage ($V_{OC}$), as can be seen in FIG. 11. Thus, there is a trade off in selecting the HOMO and LUMO voltage differences between adjacent layers. For this reason, it is preferred that each voltage step between LUMOs in the first set 1152 and HOMOs in the second set 1154 is not more than 5 kT (0.13 eV), and more preferably, not more 3 kT (0.078 eV).

However, it is the total of the voltage steps that detract from the open-circuit voltage ($V_{OC}$), rather than the individual steps themselves. Therefore, as a practical matter, it can be a worthwhile tradeoff to include one (or even a few steps) with step amounts larger than 5 kT depending upon the materials available and other parameters such as material stability, cost, and ease of deposition. Preferably, the combined sum of the HOMO steps between adjacent layers consisting of the first set 1152 and the intermediate layer 1153, and the LUMO steps between adjacent layers consisting of the second set 1154 and the intermediate layer 1153, is between 6 kT (0.15 eV) and 40 kT (1.0 eV), with the average for each step (the combined sum minus the number of steps in the energy cascade) being at least 1 kT (0.026 eV). Of course, as described above, individual steps may be greater than or less than the average, but each step is preferably at least 1 kT. The number of steps in the energy cascade is the number of organic semiconductor layers in the cascade minus one.

One measure of whether the device meets the criteria of having a number of small steps is if the average steps size is at least 1 kT, since the average step size may be easier to empirically quantify than each individual step size. As described above the average step size may be taken using the step differences across the entire cascade. Another approach is to measure the average of steps on the anode-side of the intermediate layer and separately measure the average of steps on the cathode-side of the intermediate layer. A sum of the HOMO differences between adjacent layers consisting of the first set 1152 and the intermediate layer 1153 divided by the number of layers in the first set 1152 is preferably at least 1 kT; and a sum of the LUMO differences between adjacent layers consisting of the second set 1154 and the intermediate layer 1153 divided by the number of layers in the second set 1154 is preferably at least 1 kT.

Preferably, each LUMO step in the first set 1152 of materials should be at least as large as the corresponding HOMO step ("corresponding" being at the same material interface), and each HOMO step in the second set 1154 of materials should be at least as large as the corresponding LUMO step, to minimize the possibility of a bound carrier dragging the opposite bound carrier along with it. Making the LUMO steps in the first set 1152 of materials progressively larger approaching the anode relative to the corresponding HOMO step, and making the HOMO steps in the second set 1154 of materials progressively larger relative to the corresponding LUMO step further minimizes the possibility of bound-carrier dragging by requiring increasing cumulative energy for each transition.

The first and second sets of layers are preferably also composed of photoconductive materials, although the architecture conceptually works even if some of the layers in the first set 1152 and/or second set 1154 are not photoconductive materials.

To increase the effectiveness of the simulated built-in electric field 4, the layer 1152*a* of the first set 1152 closest to the intermediate layer 1153 and the layer 1154*a* of the second set of the first set 1154 closest to the intermediate layer 1153 are each preferably no more than three monolayers thick of the respective organic semiconductor material. Making these layers thicker lessens the effectiveness of the built-in field 4, such that the layers 1152*a* and 1154*a* are preferably made as thin as possible while providing continuous coverage.

The other layers of the first set 1152 and second set 1154 may also each be no more than three monolayers thick of the respective organic semiconductor material. However, the illusion of the simulated field can be maintained even if the thickness of the layers increases slightly toward the anode and cathode, which can be advantageous by providing additional photoconductive areas for exciton generation (excitons can also be created in the first set and second set of layers, in addition to excitons created in the intermediate layer). If the thicknesses of the first set 1152 and the second set 1154 increase, preferably the increase in thicknesses is progressive, moving away from the intermediate layer 1153. However, the layer of the first set 1152 closest to the anode 120 and the layer of the second set 1154 closest to the cathode 170 are preferably each no more than ten monolayers thick (relative to the respective material).

The thickness of the intermediate layer 1153 may be maximized to increase the area for photoabsorption, but should preferably be no more than 2 exciton diffusion lengths of the photoconductive material forming the layer to minimize geminate recombination.

Figure 12:
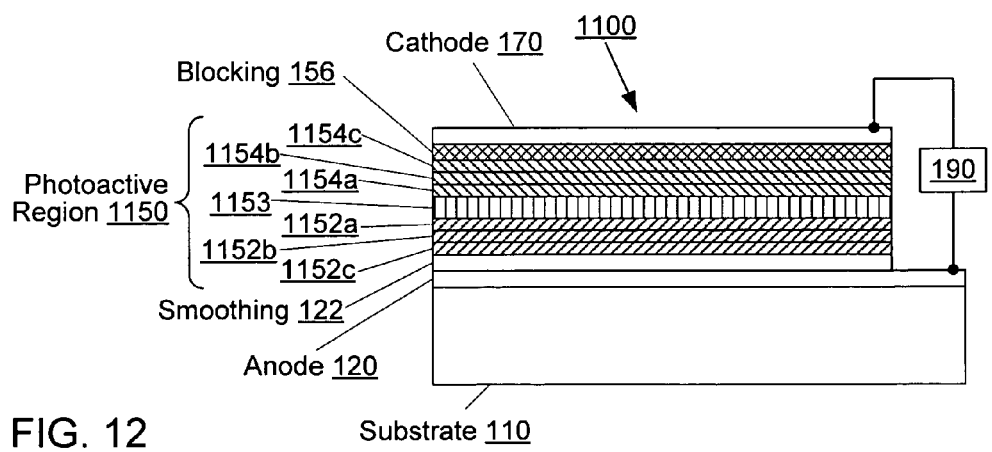
FIG. 12 illustrates an example of the energy cascade of FIG. 11 arranged as a single-cell device.

FIG. 12 illustrates the example of FIG. 11 arranged as a single-cell photosensitive device 1100, similar to the arrangement shown in FIG. 2. As illustrated, it is assumed that each of the layers in FIG. 11 is composed of a photoconductive material, such that the energy cascade is collectively referred to as a photoactive region 1150. The energy cascade, as exemplified by photoactive region 1150, may be also be utilized in a tandem configuration as a substitute for the photoactive regions 150 and 150' illustrated in FIGS. 7 and 8. If an exciton blocking layer 156 is included in the cell 1100, it is preferably not composed of a photoconductive material. Although not illustrated, an exciton blocking layer might also be included between the first set 1152 and the anode 120.

In each organic semiconductor layer of the energy cascade, the "essential" material of each layer is whatever component or components define the carrier-transport character of the respective layer. For example, if carrier transport is via dopant in a matrix material, the relevant molecule for characterizing the layer is that of the dopant molecule.

If the anode or cathode is reflective, there are further advantages to arranging the organic semiconductor materials so that materials that larger bandgap materials are closer to the reflective electrode than the smaller bandgap materials. In general, the energy gap (difference between HOMO and LUMO) of a material is proportional to the inverse of the absorption wavelength. The reflective electrode creates standing waves in the structure with peaks approximately $\lambda/4n$ away from the reflective interface, with $\lambda$ being the wavelength of the light and n being the normalized index of refraction of the organic semiconductor materials (n~2). Thus, larger bandgap materials absorbing blue should be positioned closer (e.g., 400 nm/4×2=50 nm) to the reflective surface than smaller bandgap materials absorbing red and/or infrared (e.g., 800 nm/4×2=100 nm). Spacers or additional photoactive regions (i.e., a tandem arrangement) may be included between the reflective electrode and the series of organic semiconductor layers to maximize this effect.

If the anode 120 is reflective, material bandgaps of the first set 1152 of at least three layers progressively preferably increase toward the anode 120, and the largest material bandgap of the second set 1154 of at least three layers is preferably smaller than smallest material bandgap of the first set 1152 of materials.

Likewise, if the cathode 170 is reflective, material bandgaps of the second set 1154 of at least three layers preferably progressively increase toward the cathode 170, and the largest material bandgap of the first set 1152 of at least three layers is preferably smaller than smallest material bandgap of the second set 1154 of materials.

The photoabsorption properties of the photoconductive material of the intermediate layer 1153 may be arise from a molecular complex such as an exciplex or an excimer. In such molecular complexes, two or more molecules may participate in cooperative absorption, where the complex has a different HOMO and LUMO than the constituent molecules. These complexes exist only in the excited state. In the case that the components of the complex are of a same type, the complex is an excimer, whereas a complex from two different types of molecules is an exciplex. An example of such a molecular complex is a molecular aggregate that dissociates or only weakly associates in the ground state, but more strongly associates in the excited state. For a background discussion of molecular complexes, see Chapter 5 of "Modern Molecular Photochemistry" by Nicholas J. Turro, University Science Books 1991. If an excimer or an exciplex is used as the intermediate layer 1153, the relevant HOMO and LUMO relative to the adjacent layers is that of the molecular complex, rather than the HOMO or LUMO of the constituent molecules of layer 1153.

If the photoactive region 1150 is arranged in a single-cell device, the total thickness of the photoactive region 1150 is preferably less then the reciprocal of the optical absorption coefficient of the region (plus any other materials through which incident light will pass to get to the region). Similarly, if the photoactive region 1150 is arranged in a tandem structure, the total thickness across the tandem structure to the electrode opposite the light-incident surface is preferably less then the reciprocal of the optical absorption coefficient through the combined structure.

Although the illustrated example in FIG. 12 illustrates an anode 120 on the bottom and a cathode 170 on the top, reverse structures (cathode 170 on the bottom) can of course be formed.

Although the energy cascade is demonstrated as having seven layers, more layers can be included. The number of layers of the cascade on one side of the intermediate layer 1153 may be different than the number of layer on the other side of the intermediate layer 1153.

As the layers of the first set of materials 1152 preferentially conduct holes and the layers of the second set of materials 1154 preferentially conduct electrons, the materials selected for the respective layers preferably have favorable conduction qualities (e.g., high carrier conductivity, high carrier mobility) for the respective charge carrier in order to minimize series resistance. However, since these layers are relatively thin, an operable device can be constructed which includes relatively poor hole carriers in the first set 1152 of materials and relatively poor electron carriers in the second set 1154.

The invention can be further characterized as a method for making the above structures. Any method to assemble the layers that can controllably produce thicknesses of a few monolayers may be used to form the organic photoconductive layers, and different methods can be used to form different layers. Examples of deposition methods that can be used to precisely control the thickness of thin organic layers include vacuum thermal deposition (VTE), organic molecular beam deposition (OMBD), organic vapor jet deposition (OVJD) and organic vapor phase deposition (OVPD). Molecular self-assembly, electrostatic film growth, and DNA-guided assembly techniques may also be used.

An embodiment of the method for forming the above structures includes providing a first electrode, such as an electrode on a substrate. The series of at least seven layers are thereafter deposited over the first electrode, each layer consisting essentially of a different organic semiconductor material. The organic semiconductor material of at least an intermediate layer of the sequence is a photoconductive material, as explained above. Thereafter, the second electrode is deposited over the sequence of at least seven layers. One of the first electrode and the second electrode is an anode and the other is a cathode. The organic semiconductor materials of the series of at least seven layers are arranged to provide a sequence of decreasing LUMOs and a sequence of decreasing HOMOs across the sequence from the anode to the cathode.

The steps of the HOMOs and LUMOs create the simulated built-in field, and larger and more steps make a larger field, which is desirable. However, each step also increase the open-circuit voltage ($V_{OC}$), which is not desirable. Preferably, the energy difference between a HOMO of the organic semiconductor material of the layer of the series of at least seven layers closest to the anode and a LUMO of the organic semiconductor material of the layer of the series of at least seven layers closest to the cathode is limited so that the energy difference, which corresponds to $V_{OC}$, is between 0.5 eV and 3.0 eV. More preferably, this energy difference is at least 1 eV. This energy difference can be as high as possible using organic semiconductor materials available, or which may become available. As a practical mater, it is expected that this difference (i.e., $V_{OC}$) will not be more than 3 eV using available materials, but higher differences may be possible.

EXAMPLES

Figure 13:
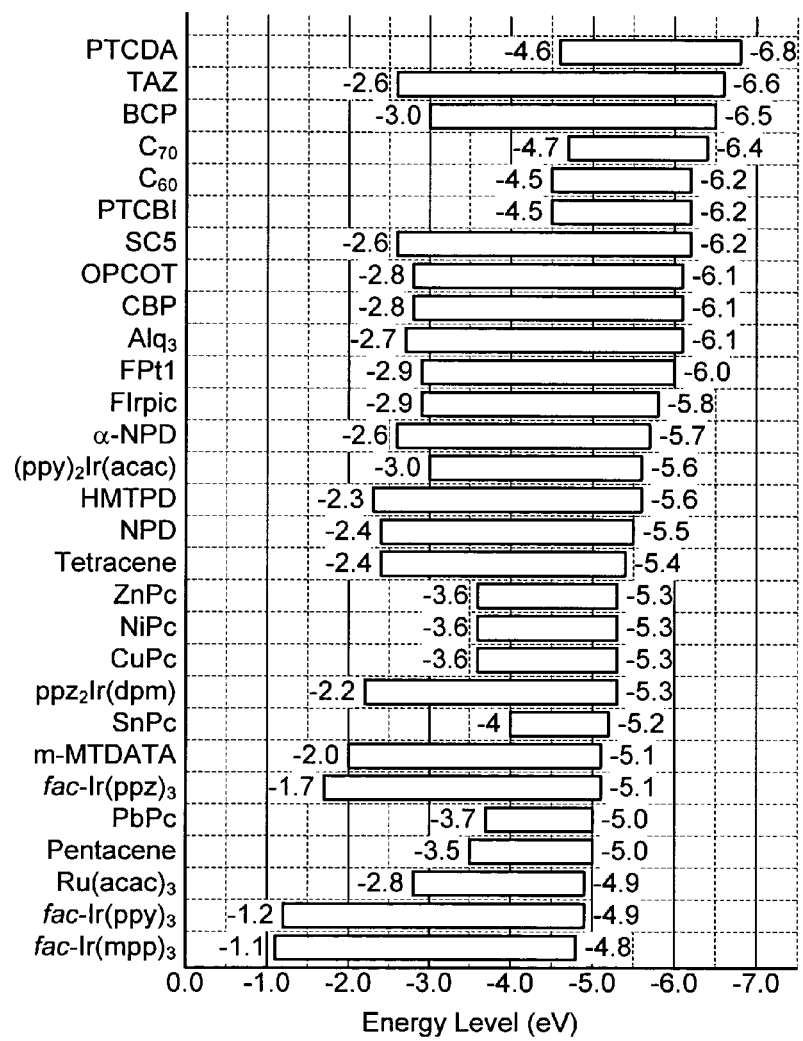
FIG. 13 illustrates examples of some of the many organic semiconductors that can be used to construct an energy cascade in accordance with the principles of the present invention.

To demonstrate the practicality of constructing the device described herein, FIG. 13 illustrates the HOMOs and LUMOs for a variety of organic semiconductor materials. The figure is oriented sideways, with vacuum level (0 eV) on the left side. The full name of the listed materials are as follows.

PTCDA: 3,4,9,10-perylenetetracarboxylic dianhydride.
TAZ: 3-phenyl-4-(1'-naphthyl)-5-phenyl-1,2,4-triazole.
BCP: 2,9-dimethyl-4,7-diphenyl-1,10-phenanthroline.
$C_{60}$: $C_{60}$.
$C_{70}$: $C_{70}$.
PTCBI: 3,4,9,10-perylenetetracarboxylic bis-benzimidazole.
SC5: 1,3,5-tris-phenyl-2-(4-biphenyl)benzene.
OPCOT: octaphenyl-cyclooctatetraene.
CBP: 4,4'-N,N-dicarbazole-biphenyl.
$Alq_3$: 8-tris-hydroxyquinoline aluminum.
FPt1: the following platinum(II)(2-4,6-difluorophenyl)pyridinato-N,$C^{2'}$)β-diketonate:

FIrpic: bis(2-(4,6-difluorophenyl)pyridyl-N,$C^{2'}$)iridium(III) picolinate.
α-NPD: 4,4'-bis[N-(1-napthyl)-Nphenyl-amino]biphenyl.
$(ppy)_2$Ir(acac): bis(2-phenylpyridine)iridium(III) acetylacetonate.
HMTPD: 4,4'-bis[N,N'-(3-tolyl)amino]-3,3'-dimethyl biphenyl.
NPD: N,N'-diphenyl-N—N'-di(1-naphthyl)-benzidine.
Tetracene: tetracene.
ZnPc: zinc phthalocyanine.
NiPc: nickel phthalocyanine.
CuPc: copper phthalocyanine.
$ppz_2$Ir(dpm): Iridium(III)bis(1-phenylpyrazolato,N,C2')(2,2,6,6-tetramethyl-3,5-heptanedionato-O,O).
SnPc: tin phthalocyanine.
m-MTDATA: 4,4',4"-tris(3-methylphenylphenylamino) triphenylamine.
fac-Ir(ppz)$_3$: facial tris(1-phenylpyrazolato,N,C2')fridium (III).
PbPc: lead phthalocyanine.
Pentacene: pentacene.
$Ru(acac)_3$: tris(acetylacetonato)ruthenium(III).
fac-Ir(ppy)$_3$: facial tris(2-phenylpyridine)iridium(III).
fac-Ir(mpp)$_3$: facial tris(3-methyl-2-pheynlpyridine)iridium (III).

The invention is not limited to these materials, and data for many additional materials is readily available in the organic semiconductor literature. In addition, the material bandgaps, HOMOs and LUMOs for some molecules may be tunable by changing substituents.

As is known in the art, the error in measurement of HOMOs and LUMOs can be significant. For example, with current photoelectron spectroscopy and electrochemical measurement, variations in HOMOs can be as high +/−0.1 eV and in LUMOs can be as high as 0.2-0.5 eV, particularly when comparing tests from different labs. Testing accuracy is continually improving. Meanwhile, it is recommended that candidate materials for the above described device be selected from literature, and then the LUMOs and HOMOs of each of the candidate materials be measured under the same conditions on the same equipment to minimize experimental error.

With regard to the use of kT in the above description, k is the Boltzmann constant and T is the operating temperature. Operating temperatures for organic photosensitive devices are commonly specified as having an operating range of T=−40° C. to +100° C., with a nominal operating temperature approximated as 300° K. Using the nominal operating temperature, 1 kT is approximately 0.026 eV (i.e., 1.381E-23(J/K)/1.602E-19(J/eV)×300° K) and 3 kT is approximately 0.078 eV.

As described above, organic photosensitive devices of the present invention may be used to generate electrical power from incident electromagnetic radiation (e.g., photovoltaic devices) or may be used to detect incident electromagnetic radiation (e.g., a photodetector or photoconductor cell). The architecture described herein may also have application in devices other than organic photosensitive cells. For example, the architecture might also have utility with organic light-emitting diodes and organic transistors.

Specific examples of the invention are illustrated and/or described herein. However, it will be appreciated that modifications and variations of the invention are covered by the above teachings and within the purview of the appended claims without departing from the spirit and scope of the invention.

What is claimed is:

1. An organic photovoltaic cell comprising:
    an anode and a cathode, at least one of the anode and the cathode being transparent; and
    a plurality of organic semiconductor layers between the anode and the cathode, each two adjacent layers of the plurality of organic semiconductor layers being in direct contact, the plurality of organic semiconductor layers comprising:
        an intermediate layer consisting essentially of a photoconductive material having a lowest unoccupied molecular orbital (LUMO) and a highest occupied molecular orbital (HOMO);
        a first set of at least three layers between the intermediate layer and the anode, each layer of the first set consisting essentially of a different organic semiconductor material having a higher LUMO and a higher HOMO, relative to an adjacent layer of the plurality of organic semiconductor layers closer to the cathode; and a second set of at least three layers between the intermediate layer and the cathode, each layer of the second set consisting essentially of a different organic semiconductor material having a lower LUMO and a lower HOMO, relative to an adjacent layer of the plurality of organic semiconductor layers closer to the anode.

2. The organic photovoltaic cell of claim 1, wherein an energy difference between a HOMO of a layer closest to the anode of the first set and a LUMO of a layer to the second set closest to the cathode is between 0.5 eV and 3.0 eV.

3. The organic photovoltaic cell of claim 2, wherein the energy difference between the HOMO of a layer closest to the anode of the first set and the LUMO of a layer to the second set closest to the cathode is at least 1 eV.

4. The organic photovoltaic cell of claim 2, wherein an organic semiconductor material of each layer of the first set of at least three layers has a HOMO and a LUMO that is at least 0.026 eV higher relative to the material of an adjacent layer of the plurality of organic semiconductor layers closer to the cathode, and wherein an organic semiconductor material of each layer of the second set of at least three layers has a HOMO and a LUMO that is at least 0.026 eV lower relative to the material of an adjacent layer of the plurality of organic semiconductor layers closer to the anode.

5. The organic photovoltaic cell of claim 1, wherein a combined sum of the HOMO differences between adjacent layers consisting of the first set of at least three layers and the intermediate layer, and the LUMO differences between adjacent layers consisting of the second set of at least three layers and the intermediate layer, is between 0.15 eV and 1.0 eV.

6. The organic photovoltaic cell of claim 1, wherein a combined sum of the HOMO differences between adjacent layers consisting of the first set of at least three layers and the intermediate layer, and the LUMO differences between adjacent layers consisting of the second set of at least three layers and the intermediate layer, divided by a sum of the number of layers in the first set and the second set, is at least 0.026 eV.

7. The organic photovoltaic cell of claim 1, wherein a sum of the HOMO differences between adjacent layers consisting of the first set of at least three layers and the intermediate layer divided by the number of layers in the first set is at least 0.026 eV, and a sum of the LUMO differences between adjacent layers consisting of the second set of at least three layers and the intermediate layer divided by the number of layers in the second set, is at least 0.026 eV.

8. The organic photovoltaic cell of claim 1, wherein the organic semiconductor materials of the first set and the second set are photoconductive materials.

9. The organic photovoltaic cell of claim 1, wherein a layer of the first set of three layers adjacent to said intermediate layer and a layer of the second set of three layers adjacent to said intermediate layer are each no more than three monolayers thick of the respective organic semiconductor material.

10. The organic photovoltaic cell of claim 9, wherein each layer of the first set and the second set is no more than three monolayers thick of the respective organic semiconductor material.

11. The organic photovoltaic cell of claim 9, wherein layer thicknesses of the first set of at least three layers progressively increase toward the anode, and the layer thicknesses of the second set of at least three layers progressively increase toward the cathode.

12. The organic photovoltaic cell of claim 11, wherein a layer of the first set of at least three layers closest to the anode and a layer of the second set of at least three layer closest to the cathode are no more than ten monolayers thick.

13. The organic photovoltaic cell of claim 1, wherein material bandgaps of the first set of at least three layers progressively increase toward the anode.

14. The organic photovoltaic cell of claim 13, wherein the anode is reflective.

15. The organic photovoltaic cell of claim 14, wherein the largest material bandgap of the second set of at least three layers is smaller than smallest material bandgap of the first set of materials.

16. The organic photovoltaic cell of claim 1, wherein material bandgaps of the second set of at least three layers progressively increase toward the cathode.

17. The organic photovoltaic cell of claim 16, wherein the cathode is reflective.

18. The organic photovoltaic cell of claim 17, wherein the largest material bandgap of the first set of at least three layers is smaller than smallest material bandgap of the second set of materials.

19. The organic photovoltaic cell of claim 1, wherein the photoconductive material of the intermediate layer consists essentially of molecules that form an excimer in the excited state, the HOMO and the LUMO of the photoconductive material being that of the excimer, wherein a LUMO and a HOMO of a layer of the first set of at least three layers adjacent to the intermediate layer are higher relative to the excimer, and a LUMO and a HOMO of a layer of the second set of at least three layers adjacent to the intermediate layer are lower relative to the excimer.

20. The organic photovoltaic cell of claim 1, wherein the photoconductive material of the intermediate layer consists essentially of two different types of molecules that form an exciplex in the excited state, the HOMO and the LUMO of the photoconductive material being that of the exciplex, wherein a LUMO and a HOMO of a layer of the first set of at least three layers adjacent to the intermediate layer are higher relative to the exciplex, and a LUMO and a HOMO of a layer of the second set of at least three layers adjacent to the intermediate layer are lower relative to the exciplex.

* * * * *